(12) United States Patent
Upadhyaya

(10) Patent No.: US 11,798,882 B2
(45) Date of Patent: Oct. 24, 2023

(54) SEMICONDUCTOR PACKAGE HAVING SMART POWER STAGE AND E-FUSE SOLUTION

(71) Applicant: ALPHA AND OMEGA SEMICONDUCTOR INTERNATIONAL LP, Sunnyvale, CA (US)

(72) Inventor: Prabal Upadhyaya, San Jose, CA (US)

(73) Assignee: ALPHA AND OMEGA SEMICONDUCTOR INTERNATIONAL LP, Toronto (CA)

( * ) Notice: Subject to any disclaimer, the term of this patent is extended or adjusted under 35 U.S.C. 154(b) by 426 days.

(21) Appl. No.: 17/135,026

(22) Filed: Dec. 28, 2020

(65) Prior Publication Data
US 2022/0208656 A1    Jun. 30, 2022

(51) Int. Cl.
*H01L 23/31* (2006.01)
*H01L 23/495* (2006.01)
*H01L 23/50* (2006.01)
*H01L 23/525* (2006.01)
*H01L 27/088* (2006.01)
*H01L 25/16* (2023.01)
*H02M 3/158* (2006.01)
*H01L 23/62* (2006.01)

(52) U.S. Cl.
CPC .......... *H01L 23/5256* (2013.01); *H01L 23/31* (2013.01); *H01L 23/49503* (2013.01); *H01L 23/49562* (2013.01); *H01L 23/50* (2013.01); *H01L 23/62* (2013.01); *H01L 27/088* (2013.01); *H02M 3/1582* (2013.01)

(58) Field of Classification Search
CPC ................. H01L 23/31; H01L 23/3107; H01L 23/49503; H01L 23/49524; H01L 23/49562; H01L 23/49575; H01L 23/50; H01L 23/5256; H01L 23/62; H01L 25/16; H01L 27/088; H02M 1/08; H02M 1/32; H02M 1/327; H02M 3/003; H02M 3/158; H02M 3/1582

See application file for complete search history.

(56) References Cited

U.S. PATENT DOCUMENTS

| | | | | |
|---|---|---|---|---|
| 2008/0265326 A1* | 10/2008 | Hebert | ............... | H01L 23/3135 257/355 |
| 2014/0070392 A1* | 3/2014 | Wu | ................... | H01L 23/49562 257/676 |
| 2015/0380353 A1* | 12/2015 | Bauer | ................ | H01L 23/5256 257/529 |

(Continued)

*Primary Examiner* — Omar F Mojaddedi
(74) *Attorney, Agent, or Firm* — Chen-Chi Lin

(57) ABSTRACT

A semiconductor package comprises a lead frame, a low side metal-oxide-semiconductor field-effect transistor (MOSFET), an E-fuse MOSFET, a high side MOSFET, a metal connection, a gate driver, an E-fuse IC, and a molding encapsulation. A buck converter comprises a smart power stage (SPS) network and an E-fuse solution network. The SPS network comprises a high side switch, a low side switch, and a gate driver. A drain of the low side switch is coupled to a source of the high side switch via a switch node. The gate driver is coupled to a gate of the high side switch and a gate of the low side switch. The E-fuse solution network comprises a sense resistor, an E-fuse switch, an E-fuse integrated circuit (IC), and an SD circuit.

9 Claims, 4 Drawing Sheets

(56) References Cited

U.S. PATENT DOCUMENTS

| | | | |
|---|---|---|---|
| 2018/0342467 A1* | 11/2018 | Lim | H01L 23/50 |
| 2019/0139883 A1* | 5/2019 | Gandhi | H01L 23/50 |
| 2020/0294896 A1* | 9/2020 | Navaretnasinggam | H01L 23/49562 |
| 2021/0232744 A1* | 7/2021 | Lin | H01L 25/16 |
| 2022/0115306 A1* | 4/2022 | Uchinuma | H01L 23/49524 |

* cited by examiner

SEMICONDUCTOR PACKAGE HAVING SMART POWER STAGE AND E-FUSE SOLUTION

FIELD OF THE INVENTION

This invention relates generally to a power semiconductor package operative to provide overcurrent protection. More particularly, the present invention relates to a buck converter comprising a smart power stage (SPS) network and an E-fuse solution network.

BACKGROUND OF THE INVENTION

For computing market, including data centers and servers, SPS is optimized for highest efficiency at 10%-15% duty cycle. A die size of a high Side metal-oxide-semiconductor field-effect transistor (MOSFET) is usually one-quarter of that of a low side MOSFET for an optimal balance between switching loss and conduction loss. Peak current handling capability of a MOSFET is directly proportional to the die size. Smaller die size tends to have lower peak current handling capability. In SPS, due to lower current rating high side MOSFET has higher chances of failure. If high side MOSFET fails (usually fails short) in a buck converter configuration, there is a high chance that it will cause failure of the load due to over-voltage electrical stress.

The present disclosure integrates an SPS network and an E-fuse solution network in a same semiconductor package. The E-fuse solution network detects high side MOSFET failure. An E-fuse IC monitors an on resistance ($R_{DS-ON}$) of an E-Fuse MOSFET to estimate current through the E-Fuse MOSFET. The E-fuse IC estimates average current with optimal bandwidth required to detect a shoot through event. The E-fuse IC also monitors E-Fuse MOSFET temperature and compensates for $R_{DS-ON}$ variation over temperature. A trench MOSFET with a second mirror FET can also be integrated for improved accuracy of current measurement.

SUMMARY OF THE INVENTION

The present invention discloses a semiconductor package. In one example, the semiconductor package is a buck converter. The semiconductor package comprises a lead frame, a low side metal-oxide-semiconductor field-effect transistor (MOSFET), an E-fuse MOSFET, a high side MOSFET, a metal connection, a gate driver, an E-fuse IC, and a molding encapsulation. The lead frame comprises a first die paddle, a second die paddle, and an end paddle. The low side MOSFET is flipped and is attached to the first die paddle.

A buck converter comprises a smart power stage (SPS) network and an E-fuse solution network. The SPS network comprises a high side switch, a low side switch, and a gate driver. A drain of the low side switch is coupled to a source of the high side switch via a switch node. The gate driver is coupled to a gate of the high side switch and a gate of the low side switch. The E-fuse solution network comprises a sense resistor, an E-fuse switch, an E-fuse integrated circuit (IC), and an SD circuit.

DETAILED DESCRIPTION OF THE INVENTION

Figure 1A:
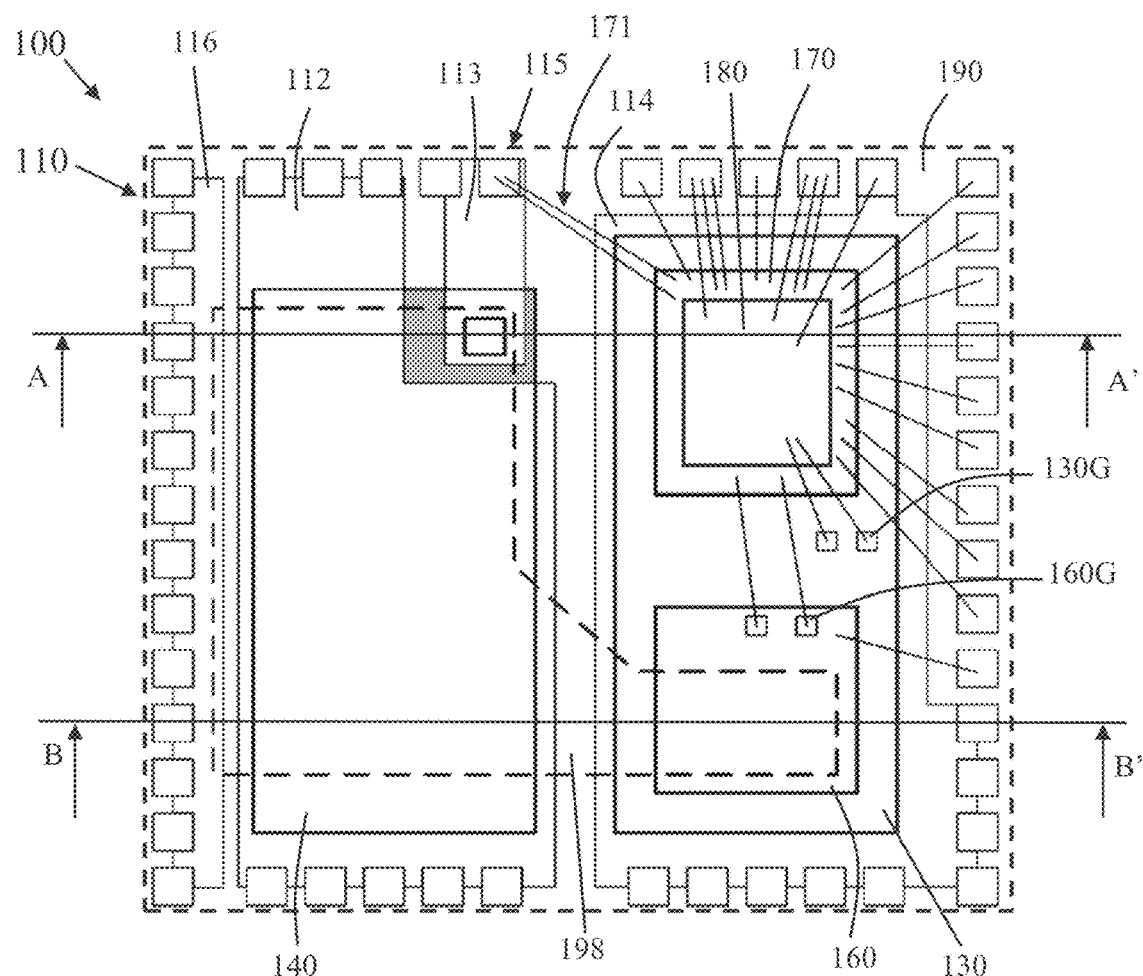
FIG. 1A shows a top view.
Figure 1B:
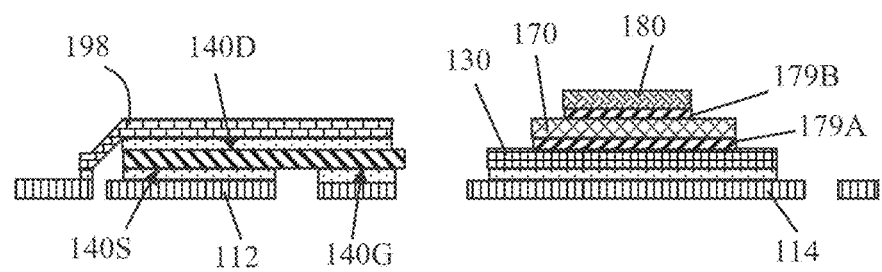
FIG. 1B shows a cross-sectional view.

FIG. 1A shows a top view, FIG. 1B shows a cross-sectional view along AA', and FIG. 1B shows a cross-sectional view along BB' of a semiconductor package 100 in examples of the present disclosure. In one example, the semiconductor package 100 is a buck converter. The semiconductor package 100 comprises a lead frame 110, a low side metal-oxide-semiconductor field-effect transistor (MOSFET) 140, an E-fuse MOSFET 130, a high side MOSFET 160, a metal connection 198, a gate driver integrated circuit (IC) 170, an E-fuse IC 180, and a molding encapsulation 190.

Figure 1C:
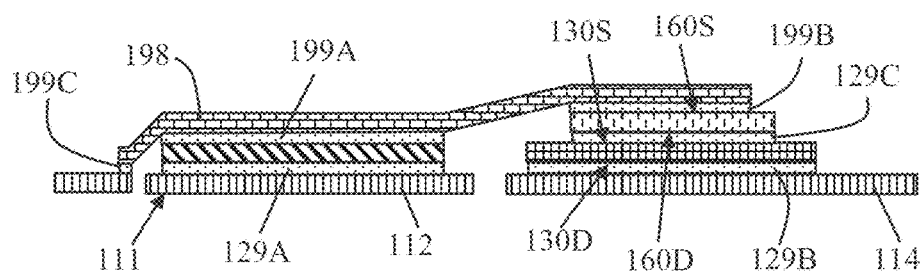
FIG. 1C shows another cross-sectional view of a semiconductor package in examples of the present disclosure.

The molding encapsulation 190 is shown as transparent and is represented by dash lines in FIG. 1A. For simplicity, the molding encapsulation 190 is not shown in FIGS. 1B and 1C.

The lead frame 110 comprises a first die paddle 112, a second die paddle 114, and an end paddle 116.

The low side MOSFET 140 is flipped and is attached to the first die paddle 112. The low side MOSFET 140 comprises a source electrode 140S and a gate electrode 140G on a top surface of the low side MOSFET 140 and a drain electrode 140D on a bottom surface of the low side MOSFET 140.

The E-fuse MOSFET 130 is attached to the second die paddle 114. The E-fuse MOSFET comprises a source electrode 130S and a gate electrode 130G on a top surface of the E-fuse MOSFET 130 and a drain electrode 130D on a bottom surface of the E-fuse MOSFET 130.

The high side MOSFET 160 is attached to the E-fuse MOSFET 130. The high side MOSFET 160 comprises a source electrode 160S and a gate electrode 160G on a top surface of the high side MOSFET 160 and a drain electrode 160D on a bottom surface of the high side MOSFET 160. The drain electrode 160D of the high side MOSFET 160 is connected to the source electrode 130S of the E-fuse MOSFET 130.

The metal connection 198, such as a metal clip, ribbon or other conductive connection, connects the drain electrode 140D of the low side MOSFET 140 and the source electrode 160S of the high side MOSFET 160 to the end paddle 116 of the lead frame 110. The gate driver IC 170 is attached to the E-fuse MOSFET 130. The E-fuse IC 180 is attached to the gate driver IC 170. The molding encapsulation 190 encloses the low side MOSFET 140, the E-fuse MOSFET 130, the high side MOSFET 160, the metal connection 198, the gate driver IC 170, and the E-fuse IC 180. The molding encapsulation 190 further encloses a majority portion of the lead frame 110. A majority portion is more than 50%. In examples of the present disclosure, a bottom surface 111 of the lead frame 110 is exposed from the molding encapsulation 190.

The metal connection 198 is electrically and mechanically connected to the drain electrode 140D of the low side MOSFET 140 by a first conductive material 199A. The metal connection 198 is electrically and mechanically connected to the source electrode 160S of the high side MOSFET 160 by a second conductive material 199B. The metal connection 198 is electrically and mechanically connected to the end paddle 116 of the lead frame 110 by a third conductive material 199C. In examples of the present disclosure, each of the first conductive material 199A, the second conductive material 199B, and the third conductive material 199C comprises a solder paste material.

The source electrode 140S of the low side MOSFET 140 is electrically and mechanically connected to the first die paddle 112 by a fourth conductive material 129A. The drain electrode 130D of the E-fuse MOSFET 130 is electrically and mechanically connected to the second die paddle 114 by a fifth conductive material 129B. The drain electrode 160D of the high side MOSFET 160 is electrically and mechanically connected to the source electrode 130S of the E-fuse MOSFET 130 by a sixth conductive material 129C. In examples of the present disclosure, each of the fourth conductive material 129A, the fifth conductive material 129B, and the sixth conductive material 129C comprises a solder paste material.

The gate driver IC 170 is attached to the E-fuse MOSFET 130 by a first non-conductive material 179A. The E-fuse IC 180 is attached to the gate driver IC 170 by a second non-conductive material 179B. Each of the first non-conductive material 179A and the second non-conductive material 179B comprises an epoxy material. In an alternate example, the E-fuse IC 180 is integrated with the gate driver IC 170 on a same IC chip.

The gate electrode 140G of the low side MOSFET is electrically connected to an extension portion 113 of the lead frame 110. The extension portion 113 of the lead frame 110 extends to an edge 115 of the lead frame 110. A plurality of bond wires 171 connect the gate driver IC 170 to the extension portion 113 of the lead frame 110.

Figure 2:
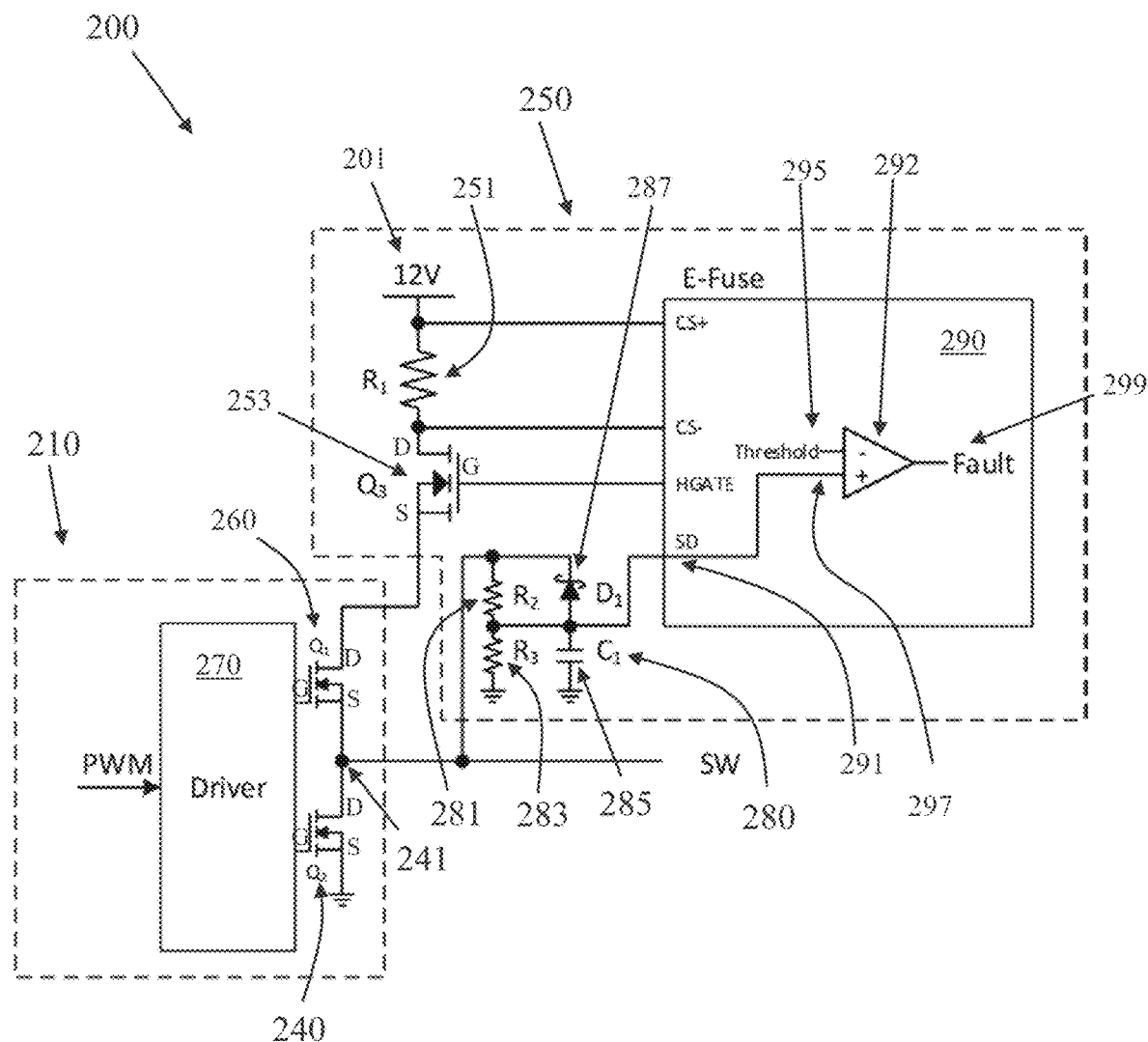
FIG. 2 is a block diagram of a buck converter in examples of the present disclosure.

FIG. 2 is a block diagram of a buck converter 200 in examples of the present disclosure. The buck converter 200 comprises a smart power stage (SPS) network 210 and an E-fuse solution network 250. The SPS network comprises a high side switch 260, a low side switch 240, and a gate driver 270. A drain of the low side switch 240 is coupled to a source of the high side switch 260 via a switch node 241. The gate driver 270 is coupled to a gate of the high side switch 260 and a gate of the low side switch 240.

The E-fuse solution network 250 comprises an optional sense resistor 251, an E-fuse switch 253, an E-fuse integrated circuit (IC) 290, and an SD circuit 280. A first node of the optional sense resistor 251 is coupled to a power source 201. In one example, power source 201 is of 12 volts. A source of the E-fuse switch 253 is coupled to a drain of the high side switch 260. The E-fuse IC 290 comprises a comparator 292. The comparator 292 comprises a reference input 295, a functional input 297, and an output 299. The functional input 297 is coupled to a short detection (SD) node 291. The SD circuit 280 comprises a first circuit resistor 281, a second circuit resistor 283, a circuit capacitor 285, and a circuit diode 287. A first node of the first circuit resistor 281 is coupled to the switch node 241 and a second node of the first circuit resistor 281 is coupled to the short detection (SD) node 291. The second circuit resistor 283 and the circuit capacitor 285 are connected in parallel between the short detection (SD) node 291 and a reference ground. The circuit diode 287 has its cathode coupled to the switch node 241 and anode coupled to the short detection (SD) node 291.

Figure 3:
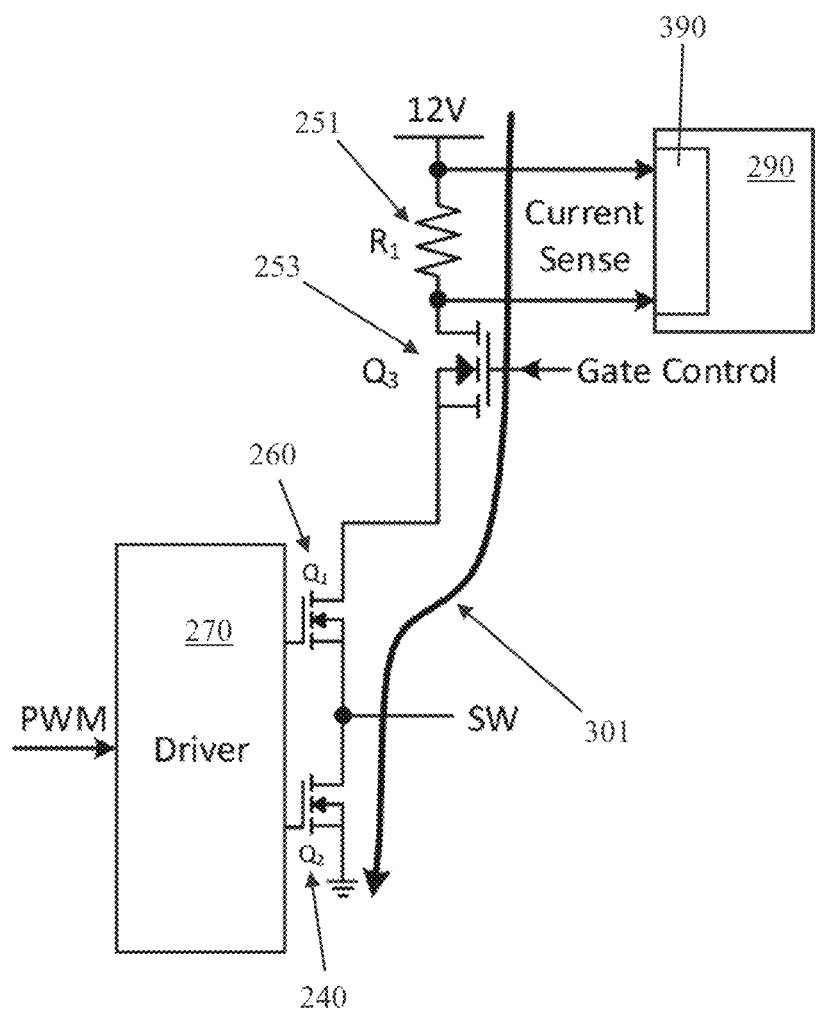
FIG. 3 shows a shoot-through event in examples of the present disclosure.

FIG. 3 shows a shoot-through event 301 in examples of the present disclosure. In examples of the present disclosure, the low side switch 240 is a first metal-oxide-semiconductor field-effect transistor (MOSFET). The high side switch 260 is a second MOSFET. Peak current handling capacity of a MOSFET is directly proportional to a size of the MOSFET. A size of the first MOSFET is larger than a size of the second MOSFET so that the high side switch 260 has lower peak current handling capacity than the low side switch 240. In examples of the present disclosure, the size of the second MOSFET is 20%-30% of the size of the first MOSFET. The E-fuse IC 290 further comprises an integrated current sense amplifier 390 measuring current through the high side switch 260. The E-fuse IC 290 turns off the E-fuse switch 253 when the current through the high side switch 260 is larger than a pre-determined value. The current through the high side switch 260 increases when the high side switch 260 is short and the gate driver 270 continues to drive the low side switch 240. In the example shown in FIG. 3, the current sense amplifier 390 detects a voltage drop across the optional sense resistor 251 to measure the current through the high side switch 260. In another example, the optional sense resistor 251 is not provided, the E-fuse IC monitors an on resistance ($R_{DS-ON}$) of the E-Fuse MOSFET to estimate current through the E-Fuse MOSFET. The current sense amplifier 390 detects a voltage drop across the E-fuse switch 253 to measure the current through the high side switch 260. The E-fuse IC also sense the temperature of the E-Fuse MOSFET to account for the temperature dependence of the $R_{DS-ON}$ of the E-Fuse MOSFET. In another example, the E-Fuse MOSFET is a trench MOSFET with a second mirror FET integrated as common drain MOSFETs for improving accuracy of current measurement. The second mirror FET has a source electrode separated from the source electrode of the E-Fuse MOSFET, and a gate electrode and a drain electrode respectively connected to the gate electrode and the drain electrode of the E-Fuse MOSFET. The E-fuse IC measure the current through the high side switch 260 by detecting a current flowing through the second mirror FET, which is only a small fraction in size of the E-Fuse MOSFET and is used as a sense FET for sensing the current through the E-Fuse MOSFET. Since the E-Fuse MOSFET and the second mirror FET are integrated on the same chip and the current through the second mirror FET can be detected directly from the source electrode of the second mirror FET without relying on $R_{DS-ON}$, the current measurement is not temperature dependence and the E-fuse IC can be simplified by eliminating temperature sensing function.

Referring now to FIG. 2, the SD circuit 280 measures a time duration when the switch node 241 stays high. A value of the functional input 297 corresponds to the time duration when the switch node 241 stays high. The output 299 of the comparator 292 flags a fault signal when the value of the functional input 297 is larger than a value of the reference input 295. The time duration increases when the high side switch 260 is short and the low side switch 240 is not turned on.

Figure 4:
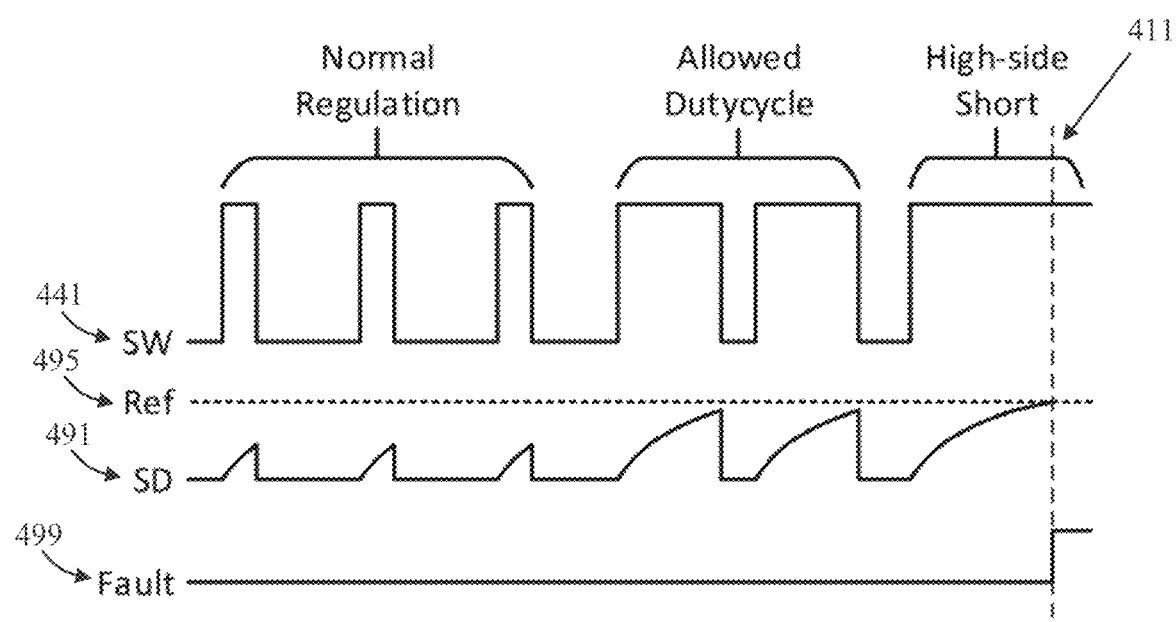
FIG. 4 is a waveform diagram in examples of the present disclosure.

FIG. 4 is a waveform diagram in examples of the present disclosure. Waveform 441 is associated with the voltage at switch node 241. Reference constant 495 is associated with the reference input 295. Waveform 491 is associated with the SD node 291. Waveform 499 is associated with the output 299 of the comparator 292.

At timing 411, short of high side switch 260 is detected. The voltage at switch node 241 stays high for a time duration longer than a timing threshold. In one example, the timing threshold is the time constant of the RC filter, that is, the product of a resistance of first circuit resistor 281 and second circuit resistor 283 connected in parallel multiples a capacitance of circuit capacitor 285. At timing 411, the voltage at SD node 291 exceeds the reference constant 495. At timing 411, waveform 499 flags a fault signal, and the E-fuse IC 290 turns off the E-fuse switch 253. The E-fuse solution network thus protects the load when the high side switch 260 is on or short for a time duration longer than a predetermined timing threshold.

Those of ordinary skill in the art may recognize that modifications of the embodiments disclosed herein are possible. For example, a number of bond wires may vary. Other modifications may occur to those of ordinary skill in this art, and all such modifications are deemed to fall within the purview of the present invention, as defined by the claims.

The invention claimed is:

1. A semiconductor package comprising:
    a lead frame comprising
        a first die paddle;
        a second die paddle; and
        an end paddle;
    a low side metal-oxide-semiconductor field-effect transistor (MOSFET) being flipped and attached to the first die paddle, the low side MOSFET comprising
        a source electrode and a gate electrode on a top surface of the low side MOSFET; and
        a drain electrode on a bottom surface of the low side MOSFET;
    an E-fuse MOSFET attached to the second die paddle, the E-fuse MOSFET comprising
        a source electrode and a gate electrode on a top surface of the E-fuse MOSFET; and
        a drain electrode on a bottom surface of the E-fuse MOSFET;
    a high side MOSFET attached to the E-fuse MOSFET, the high side MOSFET comprising
        a source electrode and a gate electrode on a top surface of the high side MOSFET; and
        a drain electrode on a bottom surface of the high side MOSFET, the drain electrode of the high side MOSFET being connected to the source electrode of the E-fuse MOSFET;
    a metal connection connecting the drain electrode of the low side MOSFET and the source electrode of the high side MOSFET;
    a gate driver integrated circuit (IC) attached to the E-fuse MOSFET;
    and
    a molding encapsulation enclosing the low side MOSFET, the E-fuse MOSFET, the high side MOSFET, the metal connection, and the gate driver IC.

2. The semiconductor package of claim 1 further comprising an E-fuse IC attached to the gate driver IC; wherein the molding encapsulation further encloses the E-fuse IC.

3. The semiconductor package of claim 1, wherein a bottom surface of the lead frame is exposed from the molding encapsulation.

4. The semiconductor package of claim 1, wherein the metal connection is a metal clip electrically and mechanically connected to the drain electrode of the low side MOSFET by a first conductive material;
    wherein the metal clip is electrically and mechanically connected to the source electrode of the high side MOSFET by a second conductive material; and
    wherein the metal clip is electrically and mechanically connected to the end paddle of the lead frame by a third conductive material.

5. The semiconductor package of claim 4, wherein each of the first conductive material, the second conductive material, and the third conductive material comprises a solder paste material.

6. The semiconductor package of claim 1 further comprising an E-fuse IC attached to the gate driver IC; wherein the molding encapsulation further encloses the E-fuse IC; wherein the gate driver IC is attached to the E-fuse MOSFET by a first non-conductive material; and wherein the E-fuse IC is attached to the gate driver IC by a second non-conductive material.

7. The semiconductor package of claim 6, wherein each of the first non-conductive material and the second non-conductive material comprises an epoxy material.

8. The semiconductor package of claim 1, wherein the gate electrode of the low side MOSFET is connected to an extension portion of the lead frame; and wherein the extension portion of the lead frame extends to an edge of the lead frame.

9. The semiconductor package of claim 8, wherein one or more bond wires connect the gate driver IC to the extension portion of the lead frame.

* * * * *